United States Patent
Hammer et al.

(10) Patent No.: US 8,169,308 B2
(45) Date of Patent: May 1, 2012

(54) METHOD FOR CHECKING THE SWITCHING REGION OF A TOUCH-FREE SWITCHING SYSTEM

(75) Inventors: Christian Hammer, Ebermannsdorf (DE); Gerhard Metz, München (DE); Richard Roskosch, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 563 days.

(21) Appl. No.: 12/310,914

(22) PCT Filed: Sep. 13, 2006

(86) PCT No.: PCT/DE2006/001599
§ 371 (c)(1),
(2), (4) Date: Mar. 12, 2009

(87) PCT Pub. No.: WO2008/031367
PCT Pub. Date: Mar. 20, 2008

(65) Prior Publication Data
US 2009/0322469 A1 Dec. 31, 2009

(51) Int. Cl.
*B60R 25/10* (2006.01)
(52) U.S. Cl. .......... 340/426.36; 340/3.1; 340/5.61; 340/5.71; 340/425.5; 340/26.1; 180/287; 180/288; 180/289; 307/10.2; 307/10.3; 307/10.4; 307/10.5
(58) Field of Classification Search .......... 340/426.36, 340/2.1, 2.2, 2.7, 3.1, 5.61, 5.62, 5.64, 5.75, 340/5.8, 12.5, 425.5, 426.1, 426.16, 539.13, 340/686.6; 307/10.1–10.5; 343/711; 180/287–289
See application file for complete search history.

(56) References Cited

U.S. PATENT DOCUMENTS

| | | | |
|---|---|---|---|
| 5,973,611 A * | 10/1999 | Kulha et al. | 340/5.62 |
| 6,552,649 B1 * | 4/2003 | Okada et al. | 340/5.61 |
| 6,778,065 B1 | 8/2004 | Asakura et al. | |
| 6,998,958 B2 * | 2/2006 | Asakura et al. | 340/5.61 |
| 7,148,584 B2 * | 12/2006 | Shibagaki et al. | 307/10.2 |
| 7,230,577 B2 * | 6/2007 | Tanaka | 343/711 |
| 2004/0046451 A1 * | 3/2004 | Shibagaki et al. | 307/10.2 |
| 2005/0046568 A1 * | 3/2005 | Tanaka | 340/539.13 |

FOREIGN PATENT DOCUMENTS

| | | |
|---|---|---|
| EP | 1 233 231 | 8/2002 |
| EP | 1 429 300 | 6/2004 |
| EP | 1 638 206 | 3/2006 |

* cited by examiner

*Primary Examiner* — George Bugg
*Assistant Examiner* — Sisay Yacob
(74) *Attorney, Agent, or Firm* — Harness, Dickey & Pierce, P.L.C.

(57) ABSTRACT

A method is disclosed for checking the switching region of a touch-free switching system with at least one sensor and at least one signal emitter, wherein the signal emitter sends data to the sensor. An extremely flexible and practical switching region check is achieved in at least one embodiment by the fact that a change in at least one system parameter of the switching system derives at least one first piece of information on the position of the signal emitter. The method represents an inexpensive possibility for checking a switching region, which has options for the definition and allocation of the switch-on, switch-off, and hysteresis regions.

32 Claims, 2 Drawing Sheets

METHOD FOR CHECKING THE SWITCHING REGION OF A TOUCH-FREE SWITCHING SYSTEM

PRIORITY STATEMENT

This application is the national phase under 35 U.S.C. §371 of PCT International Application No. PCT/DE2006/001599 which has an International filing date of Sep. 13, 2006, which designated the United States of America, the entire contents of each of which are hereby incorporated herein by reference.

FIELD OF THE INVENTION

At least one embodiment of the invention generally relates to a method for checking the switching region of a touch-free switching system with at least one sensor and at least one signal emitter, whereby the sensor receives data from the signal emitter. In addition, at least one embodiment of the invention generally relates to such a sensor and such a touch-free switching system.

BACKGROUND

A switching system or a method for checking the switching region is used both in the private sector and also in the industrial sector. The switching system has the function of detecting when a signal emitter enters into, and remains within, an effective region of the switching system and thereupon for example reporting the event or triggering a switch-on, switch-off or protective switching operation. The triggering occurs for the most part in the situation when the carrier of the signal emitter is detected within the effective region, or is detected or no longer detected for a certain period of time within this effective region. As a general rule, the carrier constitutes a mobile unit which is to be made identifiable or trackable for a sensor by the signal emitter.

For example, the safety door (shut-off barrier) of a press can be equipped with such a switching system such that when the door which carries a signal emitter is opened, this ensures that the press is unable to generate any pressure. The switching system acting in touch-free fashion consequently prevents the activation of the press while people or objects are located in the danger area.

As a general rule a touch-free switching system is implemented as a position switch or safety switch which consists of at least two independently movable parts, the sensor and the signal emitter. The sensor communicates with the signal emitter, for example by way of magnetic or electromagnetic alternating fields. For example, in response to a request from the sensor or in the presence of a magnetic or electromagnetic alternating field the signal emitter sends data which as a general rule contains a serial number as an identification number and a check sum. In principle, sending any code is sufficient, however in practice the use of a serial number, a check sum and also a freely programmable portion within the code has become accepted.

For example, the serial number can be used in order to identify the signal emitter and to possibly trigger signal emitter-dependent switching operations. The check sum on the other hand has the function of guaranteeing error-free transmission. As already described by way of example, the position switch or safety switch is provided for the purpose of releasing the safety-relevant effective region only in the situation when the signal emitter is situated within a defined switching region relative to the sensor.

Effective regions of the position switch or safety switch can in practice have extremely complicated, three-dimensional shapes. The shape of the effective region depends on the immediate surrounding area, and also on transmission-related parameters, such as the antenna for example.

As a general rule, current position switches or safety switches acting in touch-free fashion have three switching regions. Firstly, in the immediate surrounding area of the sensor itself is situated the switch-on region, which is surrounded by the so-called hysteresis region. The hysteresis region in turn is surrounded by the switch-off region. The reason for the need to distinguish between the three switching regions lies in a continuous decline in the transmission power as the distance from the sensor increases. Switching regions delimited from one another can thus be specified having regard to the tolerances.

In the case of the technologies employed up to now, the switching regions are predetermined by numerous system parameters. It should be noted that the switch-on region is separated from the switch-off region by the hysteresis region. No switching can take place within this region because no reliable detection is possible. A signal emitter or its carrier must therefore, for example, move out of the switch-off region through the hysteresis region and into the switch-on region before a switch-on can be triggered.

A position monitoring facility is known from EP 1 638 206 A2 for determining the position of a first part compared with a second part. The monitoring is accomplished by using a transceiver mounted on the first part and a transponder mounted on the second part, whereby the position limit distance can be changed by means of a movable screen.

A disadvantage resides in the fact that it is not possible to identify a plurality of switch-on regions and/or switch-off regions. Hitherto only two states of the system are possible, for example a switch-on state and a switch-off state. The user is required to tolerate the predefined switch-on and switch-off regions which were determined by the system parameters and tolerances of the equipment and to select the appropriate switching system or systems for his application. This is a very elaborate and cost-intensive procedure.

SUMMARY

At least one embodiment of the invention includes a touch-free switching system which, in a cost-effective manner, gives the user additional options for switching region monitoring and switching region definition.

A method of at least one embodiment includes having at least one first piece of information relating to the position of the signal emitter derived by changing at least one transmission parameter of the switching system. In at least one embodiment, a corresponding sensor and a corresponding, touch-free switching system, are provided in each case in order to derive at least one first piece of information relating to the position of the signal emitter by way of a change to at least one transmission parameter.

For the method according to at least one embodiment of the invention for checking the switching region one switching system with at least one sensor and at least one signal emitter is required, whereby the signal emitter sends data in response to a request sent by the sensor. The data sent by the signal emitter is analyzed depending on a change in at least one transmission parameter. Since a change in the transmission parameter brings about a change in the extent of the effective region, a first piece of information relating to the position of the signal emitter can be derived on the basis of the data.

If it is assumed that the effective region is known for a quite particular combination of transmission parameters or for a particular value of a transmission parameter, when data is correctly received from the signal emitter it is possible to conclude that the latter is located in the switching region corresponding to the transmission parameter. If the data from the signal emitter is not received or is received in an unsatisfactory manner, then the signal emitter is no longer situated in the reliable switching region. Since a flat or spatial extension of the effective region can be specified for each combination of values of the transmission parameters or of the transmission parameter, a spacer region in which the signal emitter is situated can be specified with reference to the sensor.

If a circular shape for the effective region of the sensor is assumed, for example, then the region in which the signal emitter is situated would always correspond to a ring with an inside radius and an outside radius, whereby the inside radius and outside radius can in each case be assigned to effective regions of different transmission parameters and in the case of the effective region corresponding to the inside radius data can be received for operation and in the case of the effective region corresponding to the outside radius data cannot be received in a satisfactory manner. The first piece of information relating to the position of the signal emitter corresponds here to the fact that the signal emitter is located in the ring specified in the example, whereby this first piece of information has been made possible by a one-off change in at least one transmission parameter.

It is advantageous to change the transmission parameter repeatedly. By this, the touch-free switching system has the ability to use a time sampling process, in other words to examine the respective data responses of a predefined chain of points in time at which a transmission parameter change has taken place. It is thus possible to provide for so-called tracking whereby the signal emitter or its carrier moves. In this situation, the sampling rate is based on the possible speed of the carrier or the signal emitter. The data responses for any effective regions are thus regularly sampled for certain points in time.

An advantageous embodiment has a movable or mobile carrier for at least one signal emitter. At least two advantageous applications are yielded on account of this:

On the one hand it is possible to equip a carrier which has a certain extent with two signal emitters, for example. In this manner, the signal emitters can be detected separately according to the invention or their movements can be tracked. It is consequently possible to detect that a signal emitter exits or enters the switching region, such as the switch-on region for example, during the movement. This serves to ensure that the orientation of the carrier is also known. The system is consequently in a position, depending on a particular orientation of the carrier, to bring about a switching state provided for this.

In addition, it proves to be advantageous if the movable or mobile carrier has two signal emitters, whereby both signal emitters have different receiver sensitivities. In this situation, the switching system is in a position, on the basis of the data received or not received from the signal emitters, to derive first pieces of information relating to the position of both signal emitters. The signal emitters are in this example set up in such a manner that the corresponding hysteresis regions do not overlap one another. Advantageously, the fitting of two signal emitters saves the repeated request being sent by the sensor to the signal emitters because the two responses correspond to the data from a single signal emitter which is sampled with a varying transmission parameter. Thus, the first piece of information relating to the position of the signal emitters is to be derived in an urgent manner. This serves, for example, to facilitate tracking of the movement of the carrier of the two signal emitters.

Advantageous embodiments include different modes of changing the transmission parameter or the transmission parameters. For example, a stepwise change is expedient in the situation when quite specific regions are of interest. These regions can be allocated with a predefined palette of transmission parameter values. It is possible here for example to weigh up the precision of the first piece of information relating to the position against the speed of the sampling. It is likewise advantageous to ensure a continuing sampling, for example if the switching system has not detected a signal emitter and is waiting for such a signal emitter to possibly enter a switching region. In addition, a continuous changing of transmission parameters is expedient if a high resolution is desired in respect of the position of the signal emitter.

Advantageously, according to at least one embodiment of the invention, different transmission parameters or combinations of transmission parameters are suitable for changing. Transmission parameters are understood to be parameters for the transmitting units, in other words for the signal emitter and/or where applicable for the sensor, which are suitable for influencing the effected transmission by regulating the transmitter in question. By way of example, such transmission parameters are stated under a to d:

a) The transmission power of the sensor, for example, can be used in order to change the effective region. The transmission power can be modified in a simple manner and in a variety of ways. The transmission power determines in a direct manner the strength of the magnetic or electromagnetic alternating field which supplies the signal emitter with energy where applicable.

b) A change is likewise possible as a result of altering the transmission frequency. In this situation, the activation of a signal emitter oscillating circuit is regulated. The injection is accordingly more or less optimal and regulates the injected energy. As a direct consequence, the requested data is not sent to the sensor with the intended power but at a reduced power. This may result in an incorrect detection or in a non-detection of the data by the sensor.

c) The receiver sensitivity of the sensor or signal emitter can continue to be used as a transmission parameter of the switching system. As a result of altering the receiver sensitivity, it is possible to influence the limit distance from which the signal emitter coding can still be read correctly.

d) A further transmission parameter is the period of time which can be measured between the request and the data arriving from the signal emitter. Since the period of time from the activation of the signal emitter until the signal emitter data is received correctly at the sensor is dependent on the distance of the signal emitter from the sensor, it is consequently possible to deduce the distance. This transmission parameter of the switching system is consequently dependent both on the sensor and also on the signal emitter.

A further advantageous embodiment provides a change in a transmission parameter for the sensor, whereby the dimensions in terms of area of at least one switching region, in particular of one switch-on region, one switch-off region or one hysteresis region are defined. On account of the transmit/receive systems used in the sensor and in the signal emitter, in the case of optimal system parameters there results a maximum possible spacing between sensor and signal emitter at which the signal emitter response can still be reliably recognized by the sensor. Inside the region determined by this maximum spacing a maximum extent of the effective region can be specified. As a consequence, the specifiable switch-on regions can only lie inside the maximum possible effective region, but can also be specified in their respective extent.

At least one switch-off region can also be defined inside the maximum effective region. In addition, it is for example possible by using a value table for the transmission parameter intended to be changed to specify the location within the maximum effective region at which switch-on or switch-off regions are defined. In this situation, the number of switch-on and switch-off regions is not specified. In particular it is possible to define a switch-off region in the immediate surrounding area of the sensor. This guarantees the greatest possible level of flexibility for the user.

Advantageously, a switching operation is triggered by the switching system if the signal emitter enters one of the switching regions. The same applies upon entry into a switch-off region. The switching operation can for example comprise a protective switching operation or a switch-on and/or switch-off operation.

Advantageously, by using a second sensor it is possible to derive a third piece of information relating to the position of the signal emitter in order to increase the precision of the signal emitter position.

In an advantageous embodiment, the first piece of information from the first sensor and the third piece of information from a second sensor can be combined in such a manner that switching operations can be triggered depending on the combination. On account of the increased precision with regard to determining the position of the signal emitter it is possible to enable an extremely localized detection and to make a switching operation dependent on this.

Further advantageous embodiments and preferred developments of the invention are set down in the descriptions of the figures and/or in the subclaims.

BRIEF DESCRIPTION OF THE DRAWINGS

The invention will be described and explained in detail in the following with reference to the example embodiments illustrated in the figures.

In the drawings.

DETAILED DESCRIPTION OF THE EXAMPLE EMBODIMENTS

Figure 1:
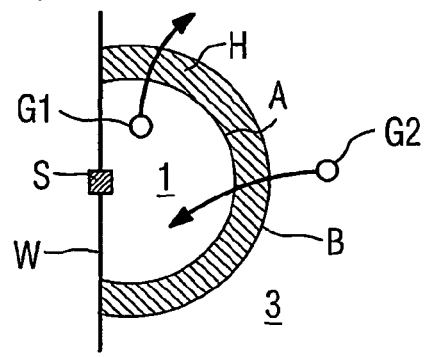
FIG. 1 shows a touch-free switching system of a first example embodiment with a semicircular switch-on region.

FIG. 1 shows a touch-free switching system of a first example embodiment with a semicircular switch-on region 1. The touch-free switching system has a sensor S on a reference surface W. The effective region of the sensor S cannot be extended beyond the reference surface W. In addition, in its immediate surrounding area the sensor S has a semicircular switch-on region 1 which is enclosed in a hysteresis region H. Behind the hysteresis region H follows the switch-off region 3, as a result of which the hysteresis region H is restricted to a ring segment. The ring-shaped dimensions of the switching regions 1, H, 3 are attributable to the simplified illustration. In practice, the shape of the curve of the inner and outer hysteresis region boundary surfaces depend on many parameters. The same applies to the other switching regions. The switch-on region 1 is delimited by the boundary A of the switch-on region. The boundary B separates the switch-off region from the hysteresis region H.

In this example embodiment, the transmission power is used as a transmission parameter to be changed. A stepwise change, for example, or also a continuous change in the transmission power is possible. In addition, it is possible to start from the basis of a continuous change. This means that the effective region reduces and increases continuously depending on the transmission power. In this context, it is important that the effective region can actually extend into the switch-off region 3.

Screening elements in the effective region generally have an effect on the actual shape of the effective region and generally impede a clear definition, in particular a clear delimitation, of the switch-on and switch-off regions. An application friendly shaping of the effective region is nevertheless conceivable. However, screening elements in the effective region are a hindrance insofar as an inventive regulation of a transmission parameter cannot be achieved. Although a screen would have an influence on a transmission from a sensor S or signal emitter G1, G2, a regulation of the transmission by means of the screening element would indeed be complex because a mechanical movement of the latter would need to be implemented.

The touch-free switching system has two signal emitters G1 and G2. The first signal emitter G1 is situated at the beginning of its movement inside the switch-on region 1. The signal emitter G1 has been detected in the switch-on region 1. The system is in the switch-on state.

During the movement the signal emitter G1 passes into the hysteresis region H, whereby the switching state of the system does not change. Only on passing the boundary B of the switch-off region 3 does the system detect a certain exit from the switch-on region 1 and changes the switching state.

The change in switching state in the case of a switch-on operation functions in a corresponding fashion. For example, the signal emitter G2 which is located in the switch-off region 3 could migrate towards the sensor S. The switching state of the switching system does not change on passing the boundary B of the switch-off region 3. Only upon entry into the switch-on region 1 across the boundary A does a change in switching state take place.

The touch-free switching system can in this situation be provided for only a first signal emitter G1 or only for a second signal emitter G2 or for both signal emitters G1, G2. If the switching system is provided only for one signal emitter, then it has two possible switching states, depending on whether the signal emitter has most recently been in the switch-on region 1 or in the switch-off region 3. If the switching system is designed for two signal emitters, then a total of four different switching states can be provided. The number of switching states changes according to the number of signal emitters.

The hysteresis region H is provided so as to guarantee a reliable detection of the signal emitters G1, G2 in order to thus ensure that an assured change in switching state can be executed. The width of the hysteresis region H can in this situation be used as a measure of a reliable change in switching state for operation. In order to increase the reliability of detection, an ample width would be provided. Advantageously, the hysteresis region H can be set up within wide limits.

Figure 2:
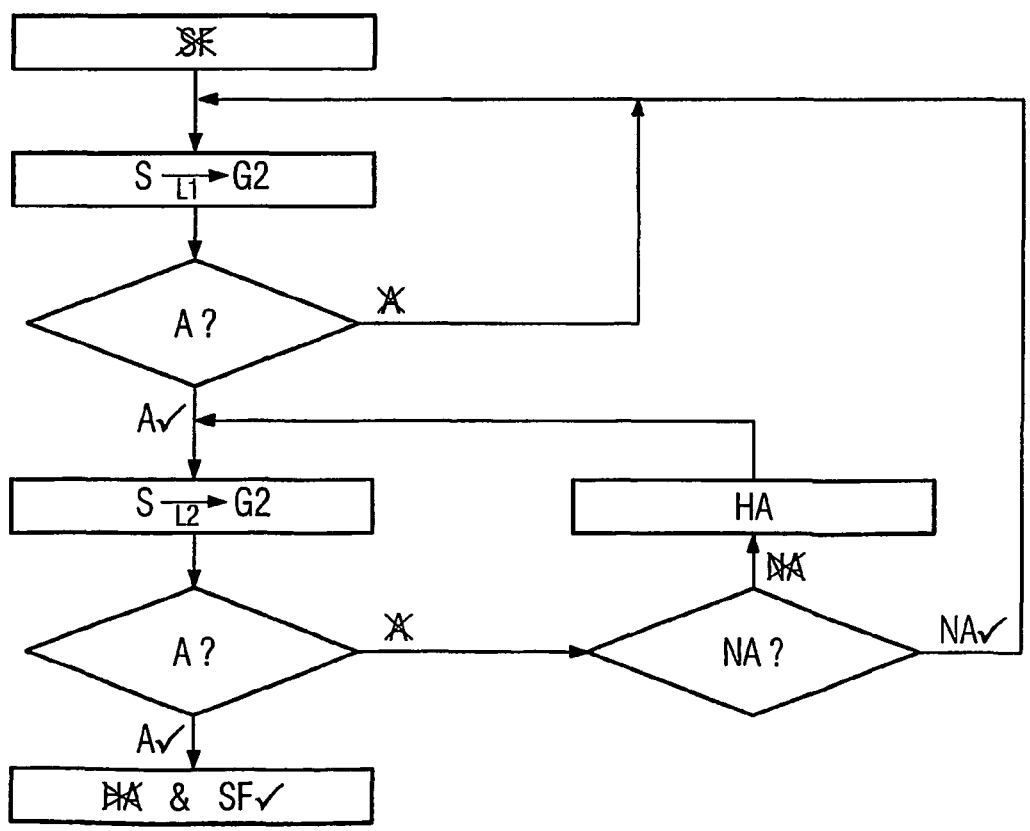
FIG. 2 shows a flowchart of the first example embodiment for the detection of a signal emitter entry.

FIG. 2 shows a flowchart of the first example embodiment for the detection of a signal emitter entry. The touch-free switching system shown in the preceding figure can be operated both by means of a continuous change in the transmission power and also by way of a stepwise change in the transmission power. A two-stage sampling on the part of the sensor S proves to be especially ergonomic. The advantage of a two-stage sampling is the ease of implementation and simplicity of the system. In this situation, the sensor S has the facility to send a request to the signal emitter G2 at either a high power L1 or a low power L2. If the sensor S sends a request with the power L1, then it is possible to detect the signal emitter G2 up to the boundary B of the switch-off region 3. If on the other hand the sensor S uses the lower power L2, then it is only possible to sample signal emitters which are situated inside the boundary A of the switch-on region 1.

At the beginning of a signal emitter entry the sensor S is in the standby position, whereby the latter sends at regular intervals with the power L1. This is also illustrated in the flowchart in FIG. 2. The rectangular boxes in the flowchart contain an action executed by the sensor S, whereas the diamond-shaped boxes are intended to symbolize the sampling of a condition. The queries each have two possible results, whereby the affirmative answer for an action is indicated by a check mark and the negation for an action is symbolized by a strike-through of the designator in question.

The rectangular box shown uppermost symbolizes the sensor S, whereby most recently the protection function SF has been inhibited, and the designator for the protection function is consequently struck through diagonally. The next rectangular box in the flowchart symbolizes the request by the sensor S to the signal emitter G2 at the high power L1. The switching system then checks in a query whether it has received a response A from the signal emitter G2 in the desired manner (error-free, for example). If the switching system has not received a response A or has not received an adequate response A from the signal emitter G2, then the sensor S again sends a request at the high power L1. This continues happening until such time as a satisfactory response A is received. In this state of the switching system it is certain that the signal emitter G2 is located in the switch-off region 3.

If a response A is received in the desired manner, then the signal emitter G2 is already situated either in the hysteresis region H or in the switch-on region 1. In order to decide in which of the two regions the signal emitter G2 is positioned the sensor S proceeds as follows:

The sensor S starts a request at low power L2 to the signal emitter G2. A query is then performed to check whether a satisfactory response A has been received from the signal emitter G2. If the response A has been received in the desired manner, then the switching system reacts in the lowermost rectangular box by releasing the safety function SF and switching off the hysteresis indicator HA. If on the other hand no response A is received in the desired manner, a further query is performed. The condition NA means an n-fold query, whereby n is a user-selectable parameter.

In the third query the switching system checks whether a response has been received for the n-th time. If this is not the case, it is certain that the signal emitter G2 cannot be situated in the switch-on region 1 and can now only be located in hysteresis region H. Consequently the switching system switches the hysteresis indicator HA on. It then once again sends a request at low power L2 to the signal emitter G2 in order to continue to ensure that a possible entry into the switch-on region 1 can be detected.

If the third query of the conditions NA is performed for the n-th time without a satisfactory response A, then the switching system begins to query again from scratch at the higher power L1. This serves to ensure that in the event of a possible return of the signal emitter G2 into the switch-off region 3 the system is once again placed in its initial state.

Figure 3:
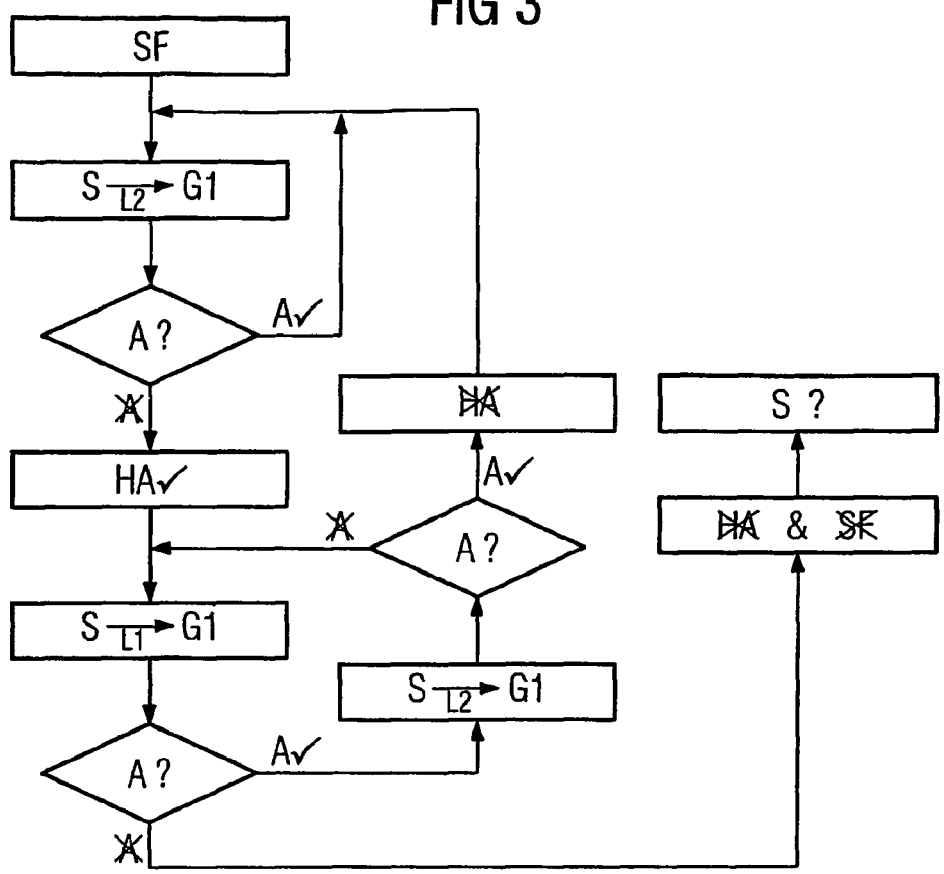
FIG. 3 shows a flowchart of the first example embodiment for the detection of a signal emitter exit.

FIG. 3 shows a flowchart of the first example embodiment for the detection of a signal emitter exit. Since the flowchart shown is intended to illustrate the exit of a signal emitter G1, it is necessary to start with the safety function SF released. This means that the signal emitter G1 is located inside the switch-on region 1 and had also already been detected. The sensor S first sends a request to the signal emitter G1 at the low transmission power L2.

In the subsequent query the response A is checked and in the event that the response A is satisfactory a query is again performed at the low power L2 in the next step in order to detect a possible exit from the switch-on region 1 by the signal emitter G1. If the response A is not received as requested, then the signal emitter G1 must already at least be situated in the hysteresis region H, for which reason the switching system switches on the hysteresis indicator HA. The sensor S then switches over to sampling the signal emitter G1 at the high power L1.

If the sensor S does not receive a satisfactory response A, then the switching system switches the hysteresis indicator HA off and inhibits the safety function SF. This means that the signal emitter G1 has moved into the switch-off region 3 and the system is no longer able to interrogate it. At this point the switching system could switch over to the procedural method illustrated in the flowchart from FIG. 2, in other words monitoring for a possible signal emitter entry. If the sensor S receives a satisfactory response A after sending a request at the high power L1, then it is certain that the signal emitter G1 is located in the hysteresis region H.

The sensor S consequently routinely performs its query again at the low power L2. If a satisfactory response A is received, then the switching system switches the hysteresis indicator HA off and continues performing its query at the low power L2. This means that the signal emitter G1 has made its way back into the switch-on region 1 and now only needs to be monitored. If the response is not satisfactory, then it is not certain whether the signal emitter G1 is possibly to be sought once again in the hysteresis region H. Consequently, the switching system begins once again with a request at the high transmission power L1 to the signal emitter G1 and the hysteresis indicator HA remains active.

Figure 4:
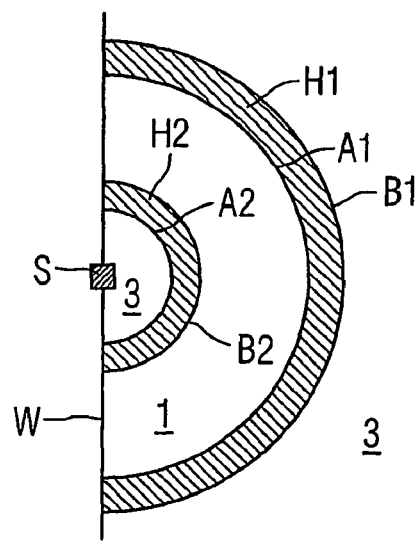
FIG. 4 shows a touch-free switching system of a second example embodiment with a ring-shaped switch-on region.

FIG. 4 shows a touch-free switching system of a second example embodiment with a ring-shaped switch-on region 1.

This example embodiment furthermore has two switch-off regions 3 and two hysteresis regions H1, H2. In practice it is often useful if a signal emitter can be mounted not directly on the sensor reference surface W, to make the position switch or safety switch more tamper-proof with the use of an additional switch-off region 3.

Similar to what has already been described in the first example embodiment, a switch-on operation takes place if a signal emitter G1, G2 passes across either the boundary B2 or the boundary A1 in the direction of the switch-on region 1. Conversely, a switch-off operation takes place if the boundary B1 or A2 is crossed in the direction of the respective switch-off region 3. Through the choice of these boundaries A1, A2, B1, B2, the extents of both hysteresis regions H1, H2 can be chosen independently of one another. The execution procedures for the signal emitter entry and exit are similar to those from FIGS. 2 and 3.

Use of multiple hysteresis regions almost at will has thus become possible. Each radius within the maximum possible effective region is thus to be assigned to a value of the transmission parameter, here the transmission power. In the same manner as the different switching regions are allocated, thus the transmission power as a transmission parameter can also be distributed. In addition, ranges for the transmission parameter can be assigned to the respective switching regions. This means that the hysteresis regions H1, H2 or the switch-off regions 3 and the switch-on region 1 can be set up in wide limits. Any desired number of switch-on regions 1 and switch-off regions 3 can be defined and the entry of a signal emitter into the respective regions can be indicated. Consequently, the system proves to be extremely flexible and versatile in its applicability.

In summary, at least one embodiment of the invention relates to a method for checking the switching region of a touch-free switching system with at least one sensor and at least one signal emitter, whereby the signal emitter sends data in response to a request sent by the sensor. Extremely flexible and workable switching region checking is achieved as a result in that a change in at least one system parameter of the switching system yields at least one first piece of information relating to the position of the signal emitter. The method represents a cost-effective possibility for checking a switching region which offers options for the definition and allocation of the switch-on, switch-off and hysteresis regions.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for checking a switching region of a touch-free switching system with at least one sensor and at least one signal emitter, the method comprising:
   receiving, via the at least one sensor, data from the at least one signal emitter; and
   deriving at least one first piece of information, relating to a position of the at least one signal emitter, by changing at least one transmission parameter of the switching system, wherein
      the switching region includes a switch-on region and a switch-off region, each being in an area of detection by the at least one sensor and the switch-on region and the switch-off region are separated by different boundaries of a common area in which no switching operation may be triggered.

2. The method as claimed in claim 1, wherein at least one second piece of information relating to movement of the at least one signal emitter is derived by making multiple changes to the transmission parameter of the at least one sensor.

3. The method as claimed in claim 1, wherein at least one of the at least one signal emitter and the at least one sensor is mounted on a movable or mobile carrier.

4. The method as claimed in claim 1, wherein the change in the transmission parameter takes place stepwise, continuously or regularly.

5. The method as claimed in claim 1, wherein the change in the transmission parameter of the at least one sensor represents the dimensions in terms of area of at least one switching region.

6. The method as claimed in claim 1, wherein a switching operation is triggered if the at least one signal emitter enters a switch-on region or if the switch-on region is extended beyond the position of the at least one signal emitter.

7. The method as claimed in claim 6, wherein a switch-off occurs if the at least one signal emitter enters a switch-off region or if the switch-off region is extended across the position of the at least one signal emitter.

8. The method as claimed in claim 7, wherein a hysteresis region in which no switching operation is triggered is situated between the switch-on region and the switch-off region.

9. The method as claimed in claim 6, wherein a first sensor of the at least one sensor triggers the switching operation.

10. The method as claimed in claim 1, wherein the transmission parameter of the at least one sensor is a transmission power, a receive sensitivity, a range or a modulation.

11. The method as claimed in claim 2, wherein at least one third piece of information relating to the position of the at least one signal emitter is derived by making a second change to at least one transmission parameter of a second sensor.

12. The method as claimed in claim 11, wherein a switching operation is triggered if the at least one signal emitter enters a switch-on region or if the switch-on region is extended beyond the position of the at least one signal emitter and wherein the switching operation of the switching system is triggered depending on the first piece of information in combination with the at least one third piece of information.

13. A sensor for a touch-free switching system including at least one signal emitter, the sensor being provided for receiving data from the at least one signal emitter in a switching region that includes a switch-on region and a switch-off region. each being in an area of detection by the at least one sensor and the switch-on region and the switch-off region are separated by different boundaries of a common area in which no switching operation may be triggered, and the sensor further being provided for deriving at least one first piece of information relating to a position of the at least one signal emitter via a change to at least one transmission parameter.

14. The sensor as claimed in claim 13, wherein the sensor is provided for deriving at least one second piece of information relating to movement of the at least one signal emitter by making a multiple change to at least one transmission parameter.

15. The sensor as claimed in claim 14, wherein the change in the transmission parameter of the sensor is a stepwise, continuous or regular change.

16. The sensor as claimed in claim 13, wherein dimensions in terms of area of at least one switching region of the sensor is representable by the change in the transmission parameter of the sensor.

17. The sensor as claimed in claim 13, wherein a switch-on operation is triggerable at least one of when the at least one signal emitter enters a switch-on region of the sensor and when the switch-on region is extended beyond the position of the at least one signal emitter.

18. The sensor as claimed in claim 13, wherein a switch-off operation is triggerable at least one of when the at least one signal emitter enters a switch-off region of the sensor and when the switch-off region is extended beyond the position of the at least one signal emitter.

19. The sensor as claimed in claim 13, wherein no switching operation is triggerable at least one of when the at least one signal emitter enters a hysteresis region of the sensor and when the hysteresis region is extended beyond the position of the at least one signal emitter.

20. The sensor as claimed in claim 13, wherein the sensor triggers at least one of a switch-on operation and a switch-off operation.

21. The sensor as claimed in claim 13, wherein the transmission parameter of the sensor is a transmission power, a receive sensitivity, a range or a modulation.

22. A touch-free switching system with at least one signal emitter and at least one sensor as claimed in claim 13, wherein the sensor is provided for receiving data from the at least one signal emitter and wherein the touch-free switching system is provided for deriving at least one first piece of information relating to a position of the at least one signal emitter via a first change to at least one transmission parameter.

23. The touch-free switching system as claimed in claim 22, wherein at least one second piece of information relating to a movement of the at least one signal emitter is derivable by making a multiple, first change to the transmission parameter of the sensor.

24. The touch-free switching system as claimed in claim 23, wherein at least one third piece of information relating to at least one of the position and the movement of the at least one signal emitter is derivable by making a second change to at least one transmission parameter of a second sensor.

25. The touch-free switching system as claimed in claim 24, whereby a switching operation of the switching system is triggerable depending on at least one of the first piece of information, the second piece of information, the third piece of information and a combination of the first, second and third pieces of information.

26. The method as claimed in claim 2, whereby at least one of the at least one signal emitter and the at least one sensor is mounted on a movable or mobile carrier.

27. The method as claimed in claim 2, wherein at least one of the multiple changes in the transmission parameter takes place stepwise, continuously or regularly.

28. The method as claimed in claim 5, wherein the change in the transmission parameter of the at least one sensor represents the dimensions in terms of area of at least one of one switch-on region, one switch-off region or of one hysteresis region.

29. The method as claimed in claim 28, wherein a switching operation is triggered if the at least one signal emitter enters the switch-on region or if the switch-on region is extended beyond the position of the at least one signal emitter.

30. The method as claimed in claim 29, wherein a switch-off occurs if the at least one signal emitter enters a switch-off region or if the switch-off region is extended across the position of the at least one signal emitter.

31. The method as claimed in claim 30, wherein a hysteresis region in which no switching operation is triggered is situated between the switch-on region and the switch-off region.

32. The sensor as claimed in claim 16, wherein dimensions in terms of area of one switch-on region, of one switch-off region or of one hysteresis region, is representable by the change in the transmission parameter of the sensor.

* * * * *